(12) United States Patent
Lopatin et al.

(10) Patent No.: US 6,433,379 B1
(45) Date of Patent: Aug. 13, 2002

(54) TANTALUM ANODIZATION FOR IN-LAID COPPER METALLIZATION CAPACITOR

(75) Inventors: Sergey Lopatin, Santa Clara; Steven C. Avanzino, Cupertino; Qi Xiang, San Jose; Matthew Buynoski, Palo Alto, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/777,571

(22) Filed: Feb. 6, 2001

(51) Int. Cl.$^7$ ................................................ H01L 29/72
(52) U.S. Cl. ................ 257/301; 257/532; 257/753; 257/762; 257/773
(58) Field of Search .................... 257/300, 301, 257/532, 753, 762, 773

(56) References Cited

U.S. PATENT DOCUMENTS

| | | | |
|---|---|---|---|
| 5,595,937 A | 1/1997 | Mikagi | 437/192 |
| 6,033,982 A | * 3/2000 | Lopatin et al. | 257/300 |
| 6,146,517 A | * 11/2000 | Hoinkis | 257/300 |

* cited by examiner

*Primary Examiner*—Edward Wojciechowicz
(74) *Attorney, Agent, or Firm*—Amin & Turocy, LLP

(57) ABSTRACT

The present invention relates to a method for forming in-laid copper metallization capacitors in a trench serpentine form. In one aspect of the present invention, the method includes providing a semiconductor substrate having at least one trench formed therein. A first metal layer is deposited conformally onto a trench and substrate surface. The first metal layer is then anodized to form a conformal bilayer comprising an anodic (metal) oxide layer formed over the first metal layer. A copper-conductive metal layer is then deposited conformally over the metal oxide layer to facilitate electroplating of the trench and substrate surface. The trench and substrate surface is then electroplated with copper whereby the at least one trench is filled with copper.

31 Claims, 7 Drawing Sheets

TANTALUM ANODIZATION FOR IN-LAID COPPER METALLIZATION CAPACITOR

TECHNICAL FIELD

The present invention relates to integrated circuit fabrication in general and in particular to a method for forming an in-laid copper metallization capacitor within an integrated circuit.

BACKGROUND OF THE INVENTION

There is an increasing demand for miniaturization in the integrated circuits industry. This demand has led to an ever constant reduction in the size of integrated circuit (IC) components. Such reduction in the size of the components provides for lower cost manufacture due to smaller chip size and increased yield, as well as improved circuit performance in many instances.

However, reduction in the size of some integrated circuit devices can lead to undesired results. For example, reduction in the size of a storage capacitor necessarily reduces the capacitance thereof and reduces the amount of charge which may be stored thereupon for a given bias voltage. In particular, in a conventional dynamic random access memory (DRAM) device, the charge stored by an individual memory cell must be maintained at as large a value as possible, in order for the DRAM to tolerate causes of "soft" errors, i.e., data loss, due to the impingement of alpha particles and other charged particles upon the memory device. In order to maintain the storage capacitance when the capacitor surface area is reduced, various techniques such as reduction of the dielectric thickness, and increase of the bias voltage have been used. However, the reliability of the storage capacitor is adversely affected by either of such techniques, as tunneling of the stored charge increases directly with the applied voltage and inversely with the thickness of the dielectric.

One technique for increasing the capacitance of a storage capacitor is to use dielectric materials with high dielectric constants. Tantalum pentoxide ($Ta_2O_5$) is an example of such a material, as its dielectric constant of 22 is five times higher than that of silicon dioxide, which is a conventional storage capacitor dielectric. However, $Ta_2O_5$ is not always a compatible material for the manufacture of modern integrated circuits, as it tends to crystallize, resulting in increased leakage at a relatively low temperature for modern integrated circuit processing.

Since market forces are driving the integrated circuitry towards increasing operating speeds while decreasing capacitor size, it would be desirable to have a method of fabricating a capacitor structure which satisfies the increasing market demands for smaller device sizes and which provides improved filtering, timing and energy storage function.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a method for forming an in-laid copper metallization capacitor preferably in a trench serpentine formation. The present invention accomplishes this end by using a tantalum anodization process which is compatible with a dual or single copper in-laid (damascene) approach.

In one aspect of the present invention, the method includes providing a semiconductor substrate having at least one trench formed therein. A first metal layer is deposited conformally onto the trench and substrate surface. The first metal layer is then anodized to form a conformal bilayer comprising an anodic (metal) oxide layer formed over the first metal layer. A copper-conductive metal layer is then deposited conformally over the metal oxide layer to facilitate electroplating of the trench and substrate surface. The at least one trench and substrate surface is then electroplated with copper whereby the trench is filled with copper.

In another aspect, the invention provides a method for forming an-laid copper metallization capacitor in a trench serpentine formation. The method comprises providing a semiconductor substrate having at least one trench etched therein. A tantalum layer is then deposited conformally to the trench and over the substrate. The tantalum layer then undergoes anodization, thereby forming a conformal bilayer in the at least one trench and over the substrate comprising a tantalum pentoxide layer formed over the tantalum layer.

A copper-tantalum layer is then deposited over the bilayer to form a conformal base surface suitable for electroplating. The surface, including the at least one trench and the substrate surface, is then electroplated with copper wherein the at least one trench is filled with copper. Following electroplating, the substrate surface undergoes chemical mechanical polishing (CMP) to remove the copper-tantalum, tantalum pentoxide layer and the tantalum layer from the substrate surface. A post-CMP cleaning may also be done to remove any residues associated the copper-tantalum, tantalum and tantalum pentoxide metals.

In yet another aspect, the present invention provides a system for an in-laid copper metallization capacitor containing a seed layer deposited conformally to at least one trench formed in a semiconductor substrate. A seed oxide layer is formed conformally on the seed layer. An adhesion layer is deposited conformally on the seed oxide layer, wherein the seed layer, the seed oxide layer and the adhesion layer facilitate mitigation of shorts and current leakage; and copper which is electroplated onto the substrate to fill the at least one trench.

In still another aspect, the present invention provides a system for an in-laid copper metallization capacitor containing a first tantalum layer deposited conformally to at least one trench formed in a semiconductor substrate. A tantalum pentoxide layer is then formed conformally on the first metal layer. A second tantalum layer is deposited conformally on the tantalum pentoxide layer, wherein the first tantalum layer, the tantalum pentoxide layer and the second tantalum layer facilitate mitigation and elimination of shorts and current leakage; and copper which has been electroplated onto the substrate fills the at least one trench.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1:
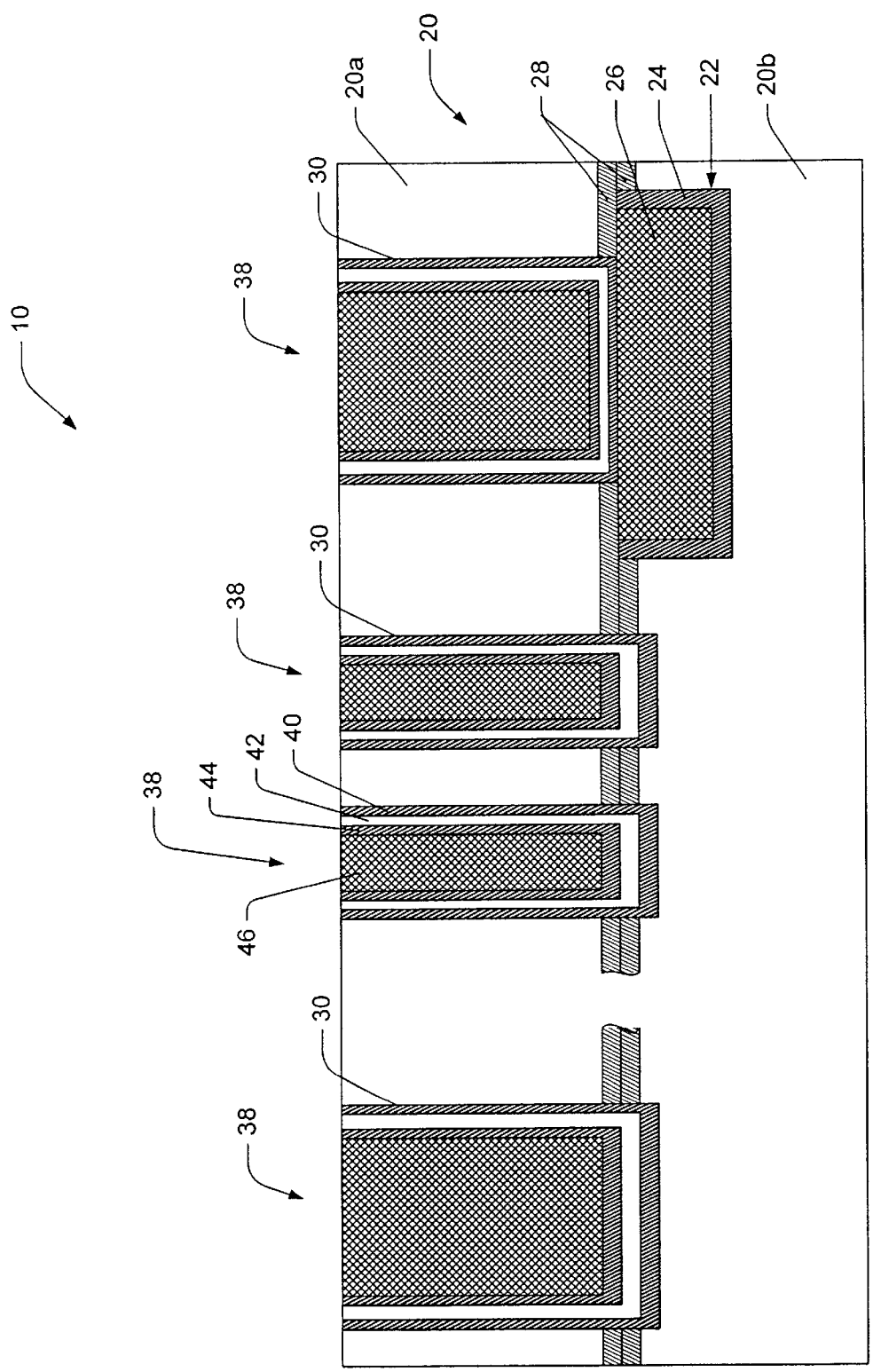
FIG. 1 is a cross-sectional illustration of a structure according to one aspect of the invention.

The present invention will now be described with reference to the drawings, wherein like reference numerals are used to refer to like elements throughout. The method of the present invention will be described with reference to the formation of an in-laid copper metallization capacitor in a trench serpentine formation via a tantalum anodization process. The following detailed description is of the best modes presently contemplated by the inventors for practicing the invention. It should be understood that the description of the aspects described herein are merely illustrative and that they should not be taken in a limiting sense. Although the invention is primarily described within the context of integrated circuit fabrication, it is to be appreciated that the present invention has wide applicability to many areas such as for example package interconnects, multi-chip module interconnects, and printed circuit board interconnects.

Referring initially to FIG. 1, a cross-sectional illustration is shown of a trench capacitor structure 10 in accordance with the present invention. The capacitor structure 10 includes an insulated substrate 20 comprising a substrate layer 20b and an insulating layer 20a and having a silicon nitride bilayer 28 formed therebetween the substrate layer 20b and the insulating layer 20a. A contact 22 is formed in the substrate layer 20b. The contact line 22 is formed by subjecting substrate layer 20b to a suitable etching process whereby a trench is formed (not shown). A conformal adhesion layer 24 is then deposited into the trench using a suitable deposition technique such as sputtering or vapor deposition. For example, the adhesion layer 24 comprising tantalum is deposited conformally into the trench associated with substrate layer 20b. The trench is then filled with copper 26 to form the contact 22. Excess tantalum on the substrate layer 20b is undesired; thus it may be removed by a chemical mechanical polishing (CMP) process or by an etching and developing technique suitable to carry out the present invention. The contact 22 connects to an in-laid copper metallization capacitor 38 and is adjacent thereto.

Figure 11:
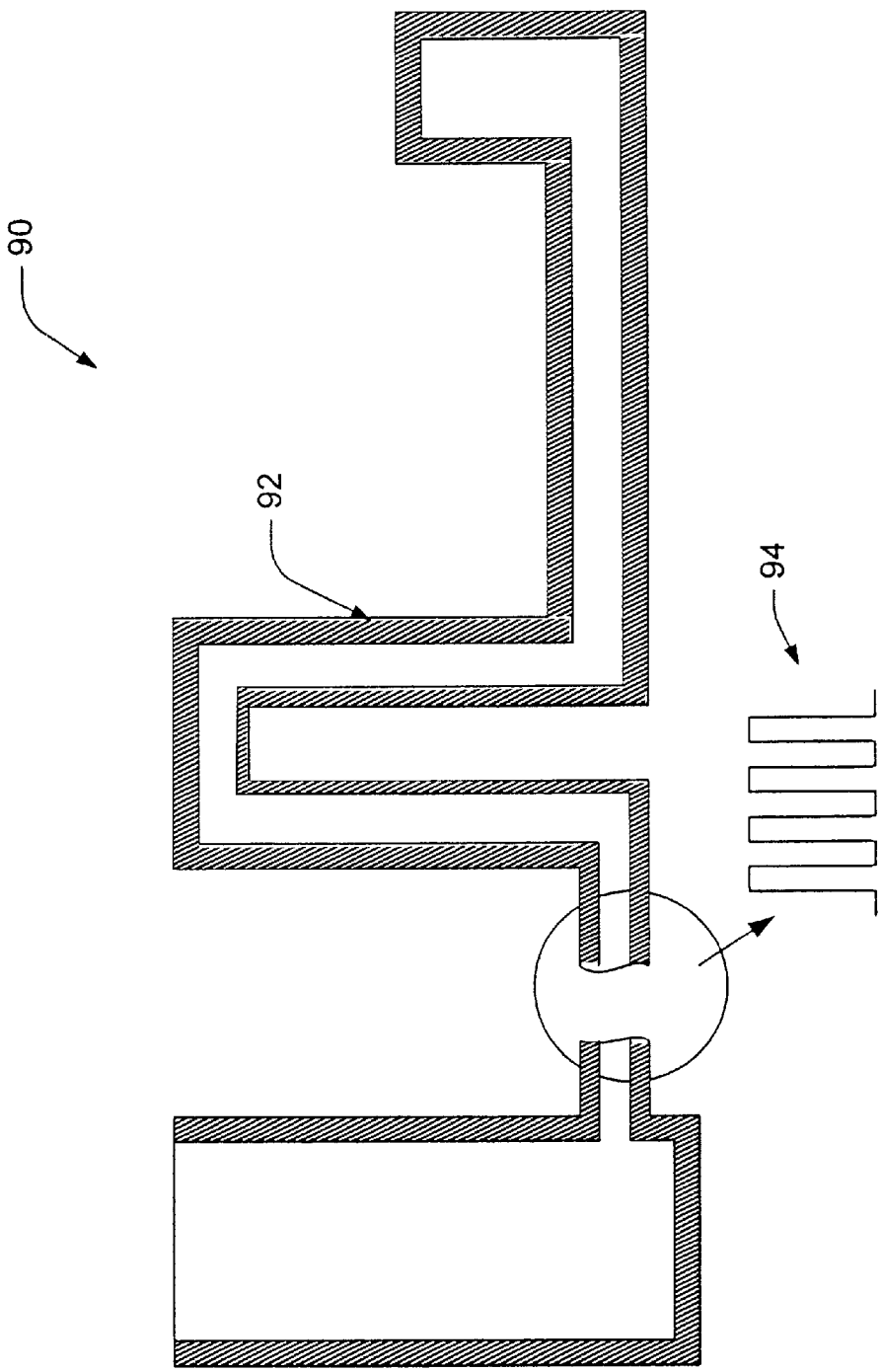
FIG. 11 is a plan view of an in-laid copper metallization capacitor structure according to one aspect of the invention.

The insulated substrate 20 also has at least one trench 30 etched therein. In the at least one trench 30, a conformal seed layer 40 is deposited. A conformal seed metal oxide layer 42 is grown over the seed layer 40. The seed oxide layer 42 is an anodic oxide film of the seed layer 40. A conformal conductive metal layer 44 is then deposited over the seed metal oxide layer 42. The at least one trench 30 is then filled with copper 46 via a copper electroplating process, thereby forming the in-laid copper metallization capacitor 38. The in-laid copper metallization capacitors 38 may be in a trench serpentine formation as shown in FIG. 11.

The structure 10 operates in a manner consistent with conventional capacitors in that one of its function is to store electrical charge. However, as will be discussed in greater detail later, utilizing a conformal tantalum anodization process combined with a dual or single copper (damascene) approach facilitates improved filtering, timing and energy storage capabilities. The conformal anodization process provides for a controlled oxidization of a top portion of the seed layer 40 (first metal layer), transforming portions of the seed layer 40 into a seed oxide layer 42 (metal oxide layer) with a thickness necessary for a desired specific capacitance, which in turn leads to improved control of capacitance.

The conformal anodization process also promotes decreased or low roughness of the seed 40-seed oxide 42 bilayer as well as low defect density associated with the seed oxide layer 42 (metal oxide layer). Both the low roughness and the low defect density as described above facilitate mitigation of shorts and current leakage associated with conventional capacitors.

Figure 2:
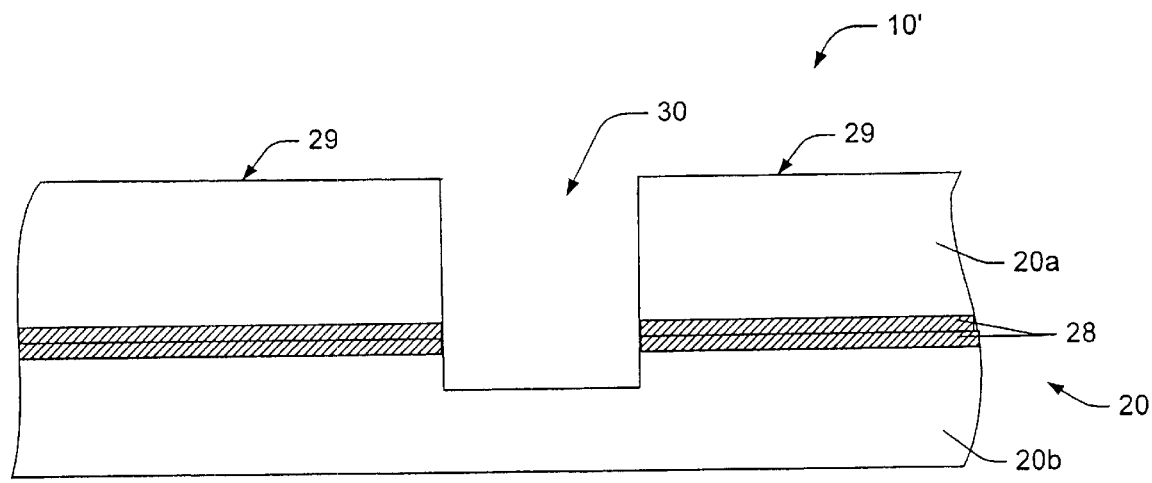
FIG. 2 illustrates a trench formed in a semiconductor substrate according to one aspect of the invention.

Referring now to FIGS. 2–9, steps for fabricating the in-laid copper metallization capacitor are described. In FIG. 2, the insulated substrate 20 is shown with the at least one trench 30 etched therein. The insulated substrate 20 comprises the insulating layer 20a ($SiO_2$ or a low dielectric k material) and the base substrate layer 20b (Si), wherein the layers 20a and 20b are separated by the silicon nitride bilayer 28. The silicon nitride bilayer may be formed using suitable techniques well known in the art. The insulating layer 20a may be formed on the silicon nitride bilayer 28 via a suitable deposition technique, such as for example by chemical vapor deposition (CVD) or by a spinning technique. The insulating layer 20a, the silicon nitride bilayer 28 and the base substrate layer 20b are referenced in common for ease of understanding as substrate 20. The substrate 20 defines a substrate surface 29. It is to be appreciated that any suitable substrate may be employed to carry out the present invention.

Figure 3:
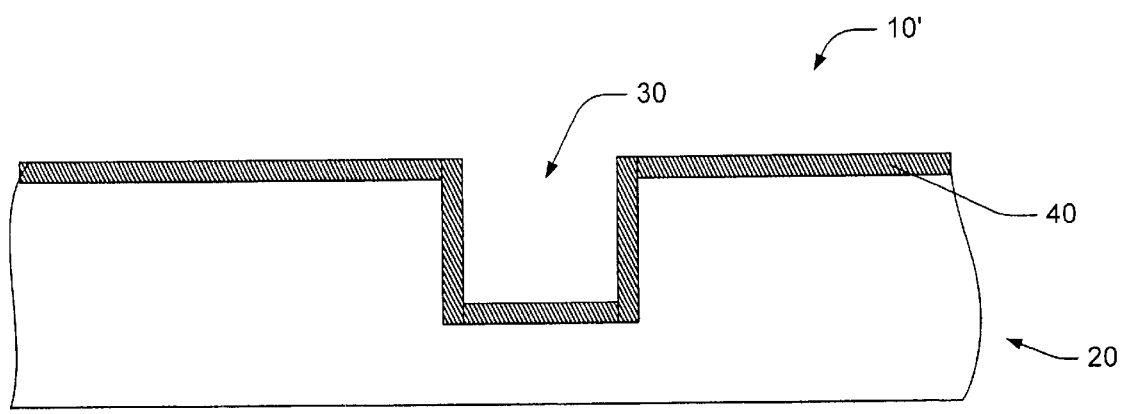
FIG. 3 illustrates a first metal layer formed on the semiconductor substrate according to one aspect of the present invention.

FIG. 3 illustrates a seed layer 40 (first metal layer) deposited conformally over the substrate 20 and the at least one trench 30 using suitable deposition techniques such as sputtering and vapor deposition. The seed layer 40 is preferably tantalum but other metals including titanium, zirconium, aluminum, niobium, tungsten, chromium and copper may be employed to carry out the present invention.

As will be described in greater detail below, portions of the seed layer 40 are transformed into an insulating anodic oxide film (seed oxide layer) via an anodization process. The anodization process may be performed using an electroplating chamber, such as one manufactured by Semitool, Inc., Applied Materials, Inc. (AMAT), and Novellus Systems, Inc. The electroplating chamber can be used for anodization by reversing the chamber's potentials at the anode and cathode electrodes and by employing an anodization solution.

Figure 4:
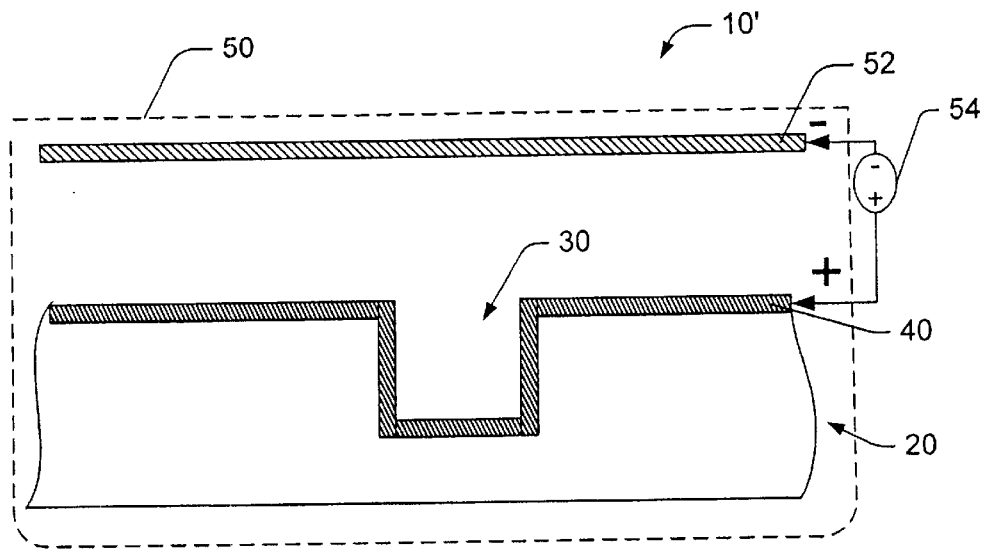
FIG. 4 is a schematic illustration of the structure of FIG. 3 being exposed to an electrolyte and the first metal layer undergoing an anodization process according to one aspect of the present invention.

FIG. 4 illustrates the partially complete capacitor structure 10' undergoing a conformal anodization process. The partially complete capacitor structure 10' is exposed to an anodization (electrolytic) solution 50 at a temperature in the range of about 17° C. to about 25° C., preferably 24° C. The anodization solution 50 is about an 80% orthophosphoric acid solution. Preferably, the anodization solution 50 comprises about 700 mL/L of orthophosphoric acid and about 300 mL/L of water. However, the anodization solution may comprise orthophosphoric acid in the range of about 500 mL/L to about 800 mL/L and water in the range of about 200 mL/L to about 500 mL/L.

A cathodic material 52 (e.g. platinum, bronze or the like) is also exposed to the anodization solution 50. A power supply 54 applies a voltage in the range of about 15V to about 27V, preferably 22V, across the cathode 52 and the partially complete capacitor structure 10' (anode). The negative terminal of the power supply 54 is coupled to the cathodic material 52, and the positive terminal of the power supply 54 is coupled at one or more locations, preferably by continuous ring contact, to structure 10'.

When the voltage is applied between the structure 10' and the opposing negative electrode 52 (cathode) in the anodization solution 50, the structure 10' serving as a positive electrode (anode) begins to anodize from its surface (e.g., seed layer 40) inwardly. The voltage and duration may be selectively applied in accordance with the thickness of the seed layer 40 and the degree of oxidation desired. The ability to control the anodization process in this manner facilitates obtaining a desired specific capacitance.

The rate of oxidation is preferably 200 Å/minute, however the rate may be controlled by the power supply 54 and anodization solution conditions. Preferably DC voltage is applied, however, an AC voltage or combination thereof may be employed. Any suitable power supply 54 such as a cell may be employed to carry out the present invention. Since the anodization process is a wet process, the seed oxide layer 42 may undergo an annealing process following anodization to further improve capacitor performance. The annealing process serves to remove undesired moisture or hydration associated with the seed oxide layer 42 which may have accumulated during the anodization process. For example, the seed oxide layer 42 may be annealed to the seed layer 40 at a temperature range of about 150° C. to about 350° C. and for a length of time suitable to carry out the present invention. The removal of moisture from or dehydration of the seed oxide layer 42 improves the contact between the seed layer 40 and the seed oxide layer 42, thereby leading to improved capacitor performance.

Figure 5:
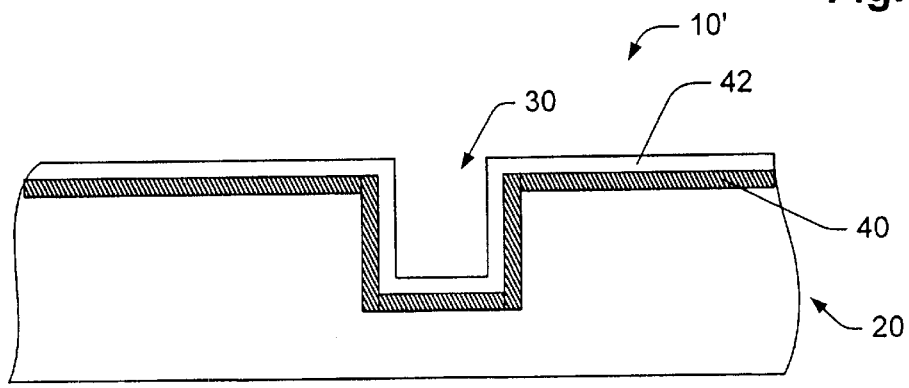
FIG. 5 illustrates portions of the first metal layer of FIG. 4 being transformed into an anodic (metal) oxide according to one aspect of the present invention.

Turning now to FIG. 5, the structure 10' is shown after having undergone the anodization process until portions of the seed layer 40 have been oxidized and transformed into the seed oxide layer 42. Portions of the seed layer 40 underlying the seed oxide layer 42 are not oxidized because the metal closest to the anodization solution 50 oxidizes first. The anodization process of the seed layer 40 creates a conformal bilayer comprising the seed oxide layer 42 overlaying the seed layer 40 in the at least one trench 30, which facilitates improved capacitor function.

For example, anodization of tantalum (first metal layer) leads to low defect density in the tantalum pentoxide layer (metal oxide layer). The oxidized tantalum (tantalum pentoxide) serves as an insulating layer or dielectric. Following anodization, low roughness of the first tantalum layer and the tantalum pentoxide layer were observed via transmission emission microscopy (TEM) cross-sections of the bilayer structure. Low roughness of these layers 40 and 42 combined with the lower defect density associated with the tantalum pentoxide layer facilitates mitigation and/or elimination of shorts and current leakages often associated with conventional capacitors.

Figure 6:
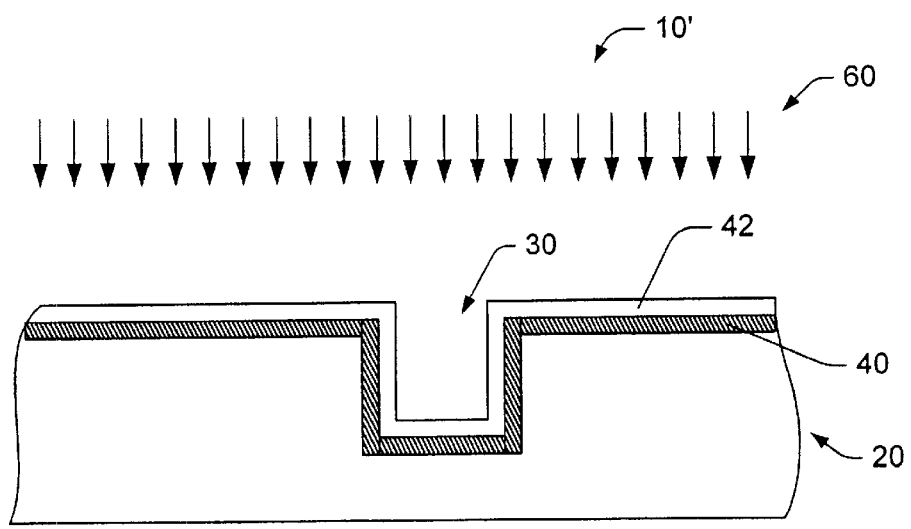
FIG. 6 illustrates a step of depositing a copper-conductive metal layer onto the metal oxide layer of FIG. 5.
Figure 7:
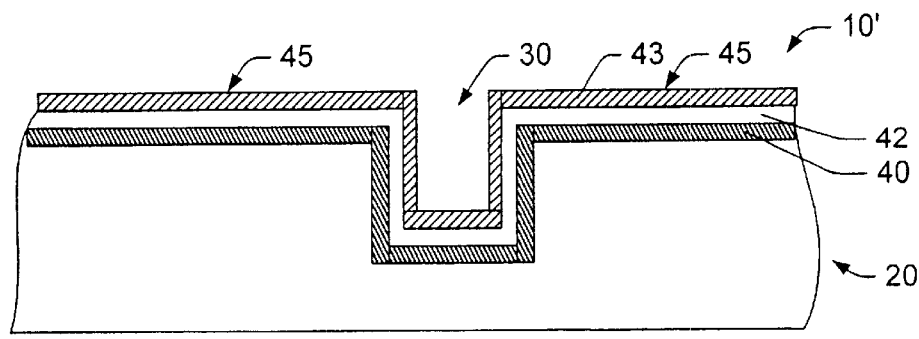
FIG. 7 illustrates a copper-conductive metal layer formed conformally on the metal oxide layer of FIG. 5 according to one aspect of the present invention.

FIGS. 6–7 illustrate forming a conformal copper-conductive metal layer 43 onto the seed oxide layer 42. Deposition of the copper-conductive metal layer 43, as shown by reference numeral 60, may be by any suitable technique such as vapor deposition or sputtering. According to one aspect of the present invention, the copper-conductive metal layer 43 is a copper-conductive metal layer. It is preferable that the metal associated with the copper-conductive metal layer 43 be of the same material as the seed layer 40 (e.g., copper-tantalum if the seed layer 40 comprises tantalum).

In FIG. 7, the structure 10' following deposition of the copper-conductive metal layer 43 is shown. The copper-conductive metal layer 43 defines a surface 45 of the structure 10'. The copper-conductive metal layer 43 forms a conformal base layer over the structure 10', including the at least one trench 30 which prepares the surface 45 of the structure 10' to undergo an electroplating process.

Figure 8:
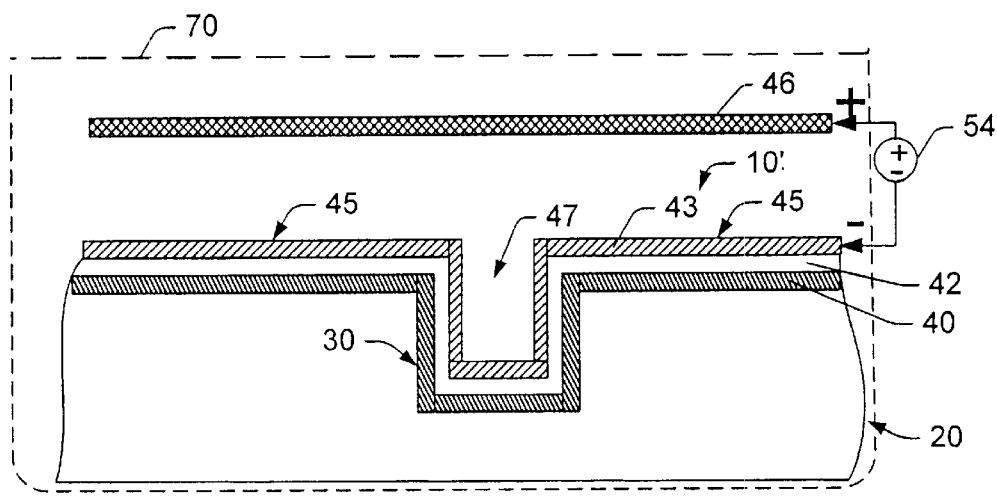
FIG. 8 illustrates a step of electroplating the structure of FIG. 7 with copper to according to one aspect of the present invention.

FIG. 8 illustrates the surface 45 of the partially complete capacitor structure 10' undergoing a copper electroplating process. The partially complete capacitor structure 10' is exposed to a suitable electroplating solution 70 (bath) for copper at a temperature, voltage and rate suitable to carry out the present invention. The electroplating solution 70 should comprise a salt of the coating metal. In the present invention, copper is the coating metal; thus, the electroplating bath 70 comprises a copper salt solution such as, but not limited to, copper sulfate. It is to be appreciated that any other suitable copper salt may be used to carry out the present invention.

The structure 10' is connected to the negative terminal and a copper anode 46 is connected to the positive terminal of the power supply 54. The power supply 54 applies a steady, direct current of a suitable voltage (e.g., 1V to 6V) across the copper anode 46 and the partially complete structure 10' (cathode). The resulting electrical field initiates electrophoretic migration of copper ions from the anode 46 to the electrically conductive surface of the cathode (structure 10') where the ionic charge is neutralized as the metal ions plate out of solution. A pulse waveform can also be applied during electroplating to fill very narrow trenches.

In the present invention, the copper anode 46 is made of metallic copper which is oxidized to soluble copper ions during the electroplating process. The copper anode 46 serves not only as the anode in the electroplating process but also as a source of copper ions in the electroplating bath to replace the copper ions consumed in the electroplating process at the cathode. The copper associated with the copper-conductive metal layer 43 is consumed during the electroplating process, transforming the copper-conductive metal layer 43 into a conductive metal layer 44. The conductive metal layer 44 may be of the same material as the seed layer 40.

Figure 9:
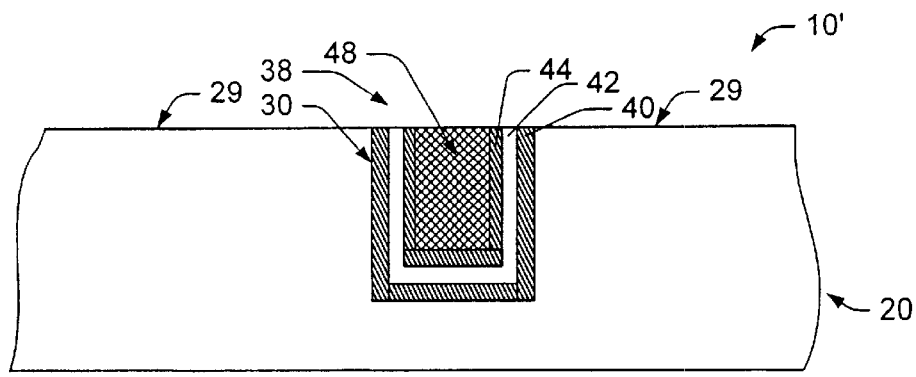
FIG. 9 illustrates an in-laid copper metallization capacitor according to one aspect of the present invention.

Upon completion of the electroplating process, a space 47 of the at least one trench 30 of structure 10' is filled with copper 48 (FIG. 9). A layer of plated copper 49 also is formed over the surface 45 (not shown). The structure 10' then undergoes chemical mechanical polishing (CMP) to remove the plated copper 49 from the surface 45 as well as the conductive metal layer 44, the seed oxide layer 42, and the seed layer 40 from along the surface 29 of the structure 10'. To mitigate residue from the metal layers existing on the surface 29, a post-CMP cleaning of the surface 29 may be performed.

FIG. 9 illustrates a completed capacitor structure 10' formed in the at least one trench 30 after the layers 40, 42, 44 and the plated copper 49 and any residue associated therewith have been removed from along the surface 29 of structure 10'.

Figure 10:
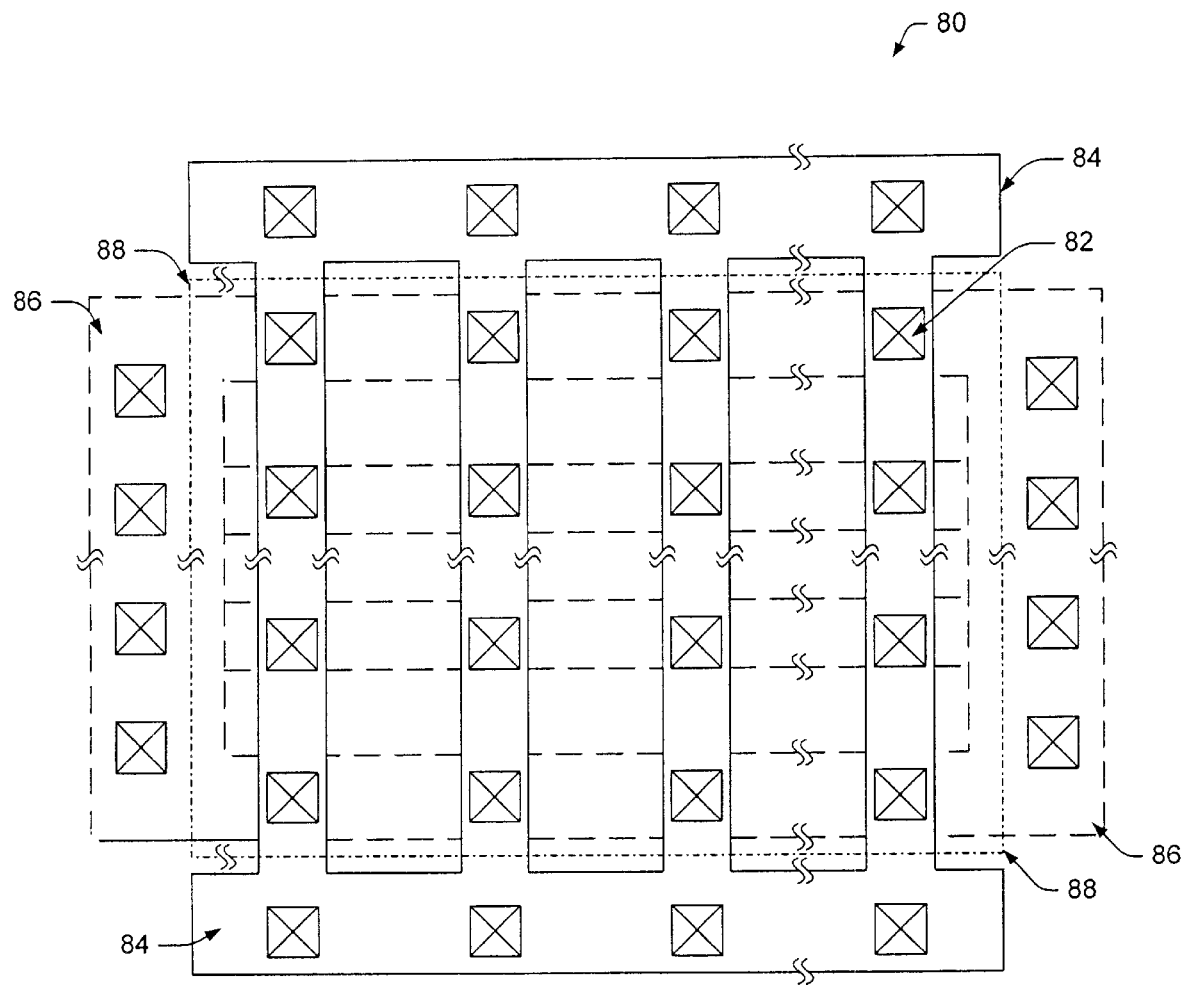
FIG. 10 is a high level schematic illustration of a high density in-laid copper metallization capacitor according to one aspect of the present invention.

In FIG. 10, a high level lay-out for a high density capacitor 80 in accordance with one aspect of the present invention is shown. The high density capacitor 80 contains vias/trenches 82 between top 84 and bottom 86 metallic capacitor plates which facilitate reducing resistance of the bottom metallic capacitor plate 86. The top 84 and bottom 86 metallic capacitor plates comprise any one of tantalum, titanium, aluminum, niobium, tungsten, chromium or copper and/or an oxide associated therewith. An anodic oxidation mask 88 lies over the top metallic capacitor plate 84.

FIG. 11 illustrates a plan view of an in-laid copper capacitor structure 90. The capacitor structure 90 contains a number of in-laid copper capacitors 92 formed in a trench serpentine formation 94.

Figure 12:
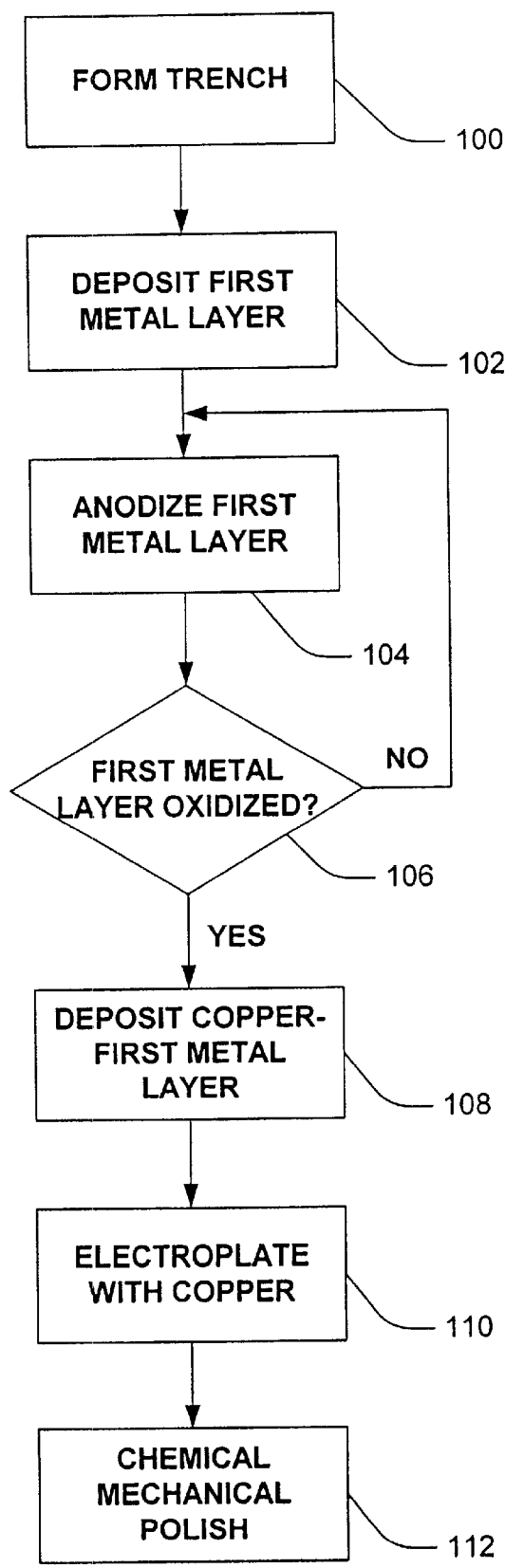
FIG. 12 is a flow diagram of a process according to one aspect of the present invention.

Turning now to FIG. 12, one methodology for carrying out the present invention is outlined via a flow diagram. In step 100, at least one trench is formed in a substrate 20. In step 102, a seed layer 40 (first metal layer) is deposited conformal to the at least one trench. Following in step 104, portions of the seed layer are oxidized via an anodization process (see FIGS. 4–5) to form a seed oxide layer 42 (e.g., metal oxide layer). In the anodization process, the power source 54 applies a voltage between the cathodic material 52 and the partially complete capacitor structure 10' (anode), both of which are exposed to an anodization solution 50 (e.g., about an 80% orthophosphoric acid solution). Anodization may take place in an electroplating chamber using an anodization solution and reversing the electric potentials.

The anodization process is performed in step 106 until portions of the seed layer 40 are oxidized with respect to its thickness to form a seed oxide layer 42 overlaying the seed layer 40. After the seed oxide layer 42 is formed, a copper-conductive metal layer 43 is deposited conformal to the at least one trench 30 in step 108. The metal associated with the copper-conductive metal layer 43 may be of the same metal as the seed layer 40. The copper-conductive metal layer 43 facilitates step 110, wherein a process of electroplating with copper is performed. In the electroplating process, the partially complete capacitor structure 10' is exposed to a suitable electroplating solution 70 (bath) for copper at a suitable temperature, voltage and rate to carry out the present invention.

The power supply 54 applies a steady, direct current of a suitable voltage (e.g., 1V to 6V) across the copper anode 46 and the partially complete structure 10' (cathode). The resulting electrical field initiates electrophoretic migration of copper ions from the anode 46 to the electrically conductive surface of the cathode (structure 10') where the ionic charge is neutralized as the metal ions plate out of solution. The copper associated with the copper-conductive metal layer 43 is consumed during the electroplating process, transforming the copper-conductive metal layer 43 into an adhesion layer 44 (second metal layer). Upon completion of the electroplating process, the at least one trench 30 of structure 10' is filled with copper 48 (FIG. 9). In step 112, the structure 10' undergoes chemical mechanical polishing (CMP) to remove the plated copper 49, the conductive metal layer 44, the seed oxide layer 42, and the seed layer 40 from along the surface 29 of structure 10'. To be certain that no residue from the metal layers exists on the surface 29, a post-CMP cleaning of the surface 29 may be performed.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for making an in-laid copper metallization capacitor comprising:

depositing a first metal layer conformally into at least one trench formed in a semiconductor substrate;

forming a metal oxide layer conformally on the first metal layer, the metal oxide layer exhibiting low defect density and the first metal layer and the metal oxide layer exhibiting low roughness which facilitate mitigation of shorts and current leakage;

depositing a second metal layer conformally on the metal oxide layer; and using copper which has been electroplated onto the substrate to fill the at least one trench.

2. The method of claim 1 comprising:

removing the first metal layer, the metal oxide layer, and the second metal layer from the substrate surface using chemical mechanical polishing and removing residual metal using a post-chemical mechanical polishing cleaning process.

3. The method of claim 1, wherein the metal oxide layer is formed over the first metal layer.

4. The method of claim 1, wherein the metal oxide layer is an anodic oxide film.

5. The method of claim 1, wherein the metal anodization occurs in solution comprising about 80% orthophosphoric acid and about 20% water.

6. The method of claim 5, wherein the solution for anodization comprises about 1000 mL of a mixture comprising about 500 mL/L to about 800 mL/L orthophosphoric acid and about 200 mL/L to about 500 mL/L water.

7. The method of claim 1, wherein anodization occurs at a rate of about 200Å/minute at a voltage in the range of about 15 V to about 27 V and a temperature in the range of about 17° C. to about 25° C.

8. The method of claim 1, wherein a first metal layer and a metal oxide layer are any one of tantalum, titanium, zirconium, aluminum, niobium, tungsten, chromium, or copper and the metal oxides thereof, respectively.

9. A method for making an in-laid copper metallization capacitor comprising:

depositing a seed layer conformally to at least one trench formed in a semiconductor substrate;

forming a seed oxide layer conformally on the seed layer, the seed oxide layer exhibiting low defect density and the seed layer and the seed oxide layer exhibiting low roughness which facilitate mitigation of shorts and current leakage;

depositing a conductive layer conformally on the seed oxide layer; and using copper which has been electroplated onto the substrate to fill the at least one trench.

10. The method of claim 9 comprising:

removing the seed layer, the seed oxide layer, and a second metal layer from the substrate surface using chemical mechanical polishing and removing residual metal using a post-chemical mechanical polishing cleaning process.

11. The method of claim 9, wherein the tantalum pentoxide layer is formed over the tantalum layer.

12. The method of claim 9, wherein the seed layer is anodized in an electroplating chamber which is converted to an anodization process chamber comprising using a solution for anodization and reversing potentials at an anode and a cathode.

13. The method of claim 12, wherein the solution for anodization comprises about 80% orthophosphoric acid and about 20% water.

14. The method of claim 13, wherein the solution for anodization comprises about 800 mL/L orthophosphoric acid and about 200 mL/L water.

15. The method of claim 9, wherein anodization occurs at a rate of about 200Å/minute at a voltage of about 22 V and a temperature of about 24° C.

16. The method of claim 9 comprising the step of annealing the tantalum pentoxide at a temperature range of about 150° C. to about 350° C. to dehydrate the tantalum pentoxide following tantalum anodization.

17. The method of claim 9, wherein a seed layer and a seed oxide layer are any one of tantalum, titanium, zirconium, aluminum, niobium, tungsten, chromium, or copper and the metal oxides thereof, respectively.

18. A structure associated with an in-laid copper metallization capacitor comprising:

a first metal layer deposited conformally into at least one trench formed in a semiconductor substrate;

a metal oxide layer formed conformally on the first metal layer, the metal oxide layer exhibiting low defect density and the first metal layer and the metal oxide layer exhibiting low roughness which facilitate mitigation of shorts and current leakage;

a second metal layer deposited conformally on the metal oxide layer; and copper which has been electroplated onto the substrate to fill the at least one trench.

19. The structure of claim 18, wherein a first metal layer and a metal oxide layer are any one of tantalum, titanium, zirconium, aluminum, niobium, tungsten, chromium, and copper and the metal oxides thereof, respectively.

20. The structure of claim 18, wherein the first metal layer is oxidized via an anodization process to form the seed oxide layer.

21. The structure of claim 18, wherein the thickness of the first metal layer and the metal oxide layer is controlled by a duration and an amount of voltage applied during the anodization process.

22. The structure of claim 18, wherein the second metal layer and the first metal layer are of the same metallic material.

23. A structure associated with an in-laid copper metallization capacitor comprising:

a seed layer deposited conformally to at least one trench formed in a semiconductor substrate;

a seed oxide layer formed conformally on the seed layer, the seed oxide layer exhibiting low defect density and the seed layer and the seed oxide layer exhibiting low roughness which facilitate mitigation of shorts and current leakage;

a conductive layer deposited conformally on the seed oxide layer; and copper which has been electroplated onto the substrate to fill the at least one trench.

24. The structure of claim 23, wherein a seed layer and a seed oxide layer are any one of tantalum, titanium, zirconium, aluminum, niobium, tungsten, chromium, and copper and the metal oxides thereof, respectively.

25. The structure of claim 23, wherein the seed layer is oxidized via an anodization process to form the seed oxide layer.

26. The structure of claim 23, wherein the thickness of the seed layer and the seed oxide layer is controlled by a duration and an amount of voltage applied during the anodization process.

27. The structure of claim 23, wherein the seed layer and the conductive layer are of the same metallic material.

28. A structure associated with an in-laid copper metallization capacitor comprising:

a first tantalum layer deposited conformally to at least one trench formed in a semiconductor substrate;

a tantalum pentoxide layer formed conformally on the first metal layer, the tantalum pentoxide layer exhibiting low defect density and the first tantalum layer and the tantalum pentoxide layer exhibiting low roughness which facilitate mitigation of shorts and current leakage;

a second tantalum layer deposited conformally on the tantalum pentoxide layer, wherein the first tantalum layer, the tantalum pentoxide layer and the second tantalum layer facilitate mitigation and elimination of shorts and current leakage; and copper which has been electroplated onto teh substrate to fill the at least one trench.

29. The structure of claim 28, wherein the first tantalum layer is oxidized via an anodization process to form the seed oxide layer.

30. The structure of claim 28, wherein the thickness of the first tantalum layer and the tantalum pentoxide layer is controlled by a duration and an amount of voltage applied during the anodization process.

31. A structure associated with manufacturing an in-laid copper metallization capacitor comprising:

means for forming at least one trench in a semiconductor substrate;

means for depositing a first metal layer on the substrate conformal to the at least one trench;

means for anodizing the first metal layer wherein portions of the first metal layer are converted to a metal oxide, thereby resulting in a conformal metal oxide-metal bilayer;

means for depositing a copper-conductive metal layer over the metal oxide layer conformally to form a substrate and a trench surface suitable for electroplating; and means for electroplating the substrate and trench surface with copper to fill the at least one trench with copper, wherein the copper associated with the copper-metal layer is consumed during the electroplating process thereby transforming the copper-metal layer into a second metal layer.

* * * * *